US 6,608,336 B2

(12) United States Patent
Kikuchi et al.

(10) Patent No.: US 6,608,336 B2
(45) Date of Patent: Aug. 19, 2003

(54) LATERAL DOUBLE DIFFUSED MOS TRANSISTOR

(75) Inventors: Shuichi Kikuchi, Gunma (JP); Eiji Nishibe, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 49 days.

(21) Appl. No.: 09/778,169

(22) Filed: Feb. 7, 2001

(65) Prior Publication Data
US 2001/0035553 A1 Nov. 1, 2001

(30) Foreign Application Priority Data
Apr. 26, 2000 (JP) ........................................ 2000-125380

(51) Int. Cl.[7] ................... H01L 29/80; H01L 31/112; H01L 29/76
(52) U.S. Cl. .................. 257/288; 257/335; 257/342
(58) Field of Search ................... 257/288, 327, 257/335, 336, 408, 341, 342, 344; 438/286, 289

(56) References Cited

U.S. PATENT DOCUMENTS 5,963,811 A * 10/1999 Chern .................... 438/289
6,030,869 A * 2/2000 Odake et al. ............. 438/266
6,093,951 A * 7/2000 Burr ........................ 257/408
6,306,712 B1 * 10/2001 Rodder et al. ........... 438/289
6,399,468 B2 * 6/2002 Nishibe et al. ........... 438/592

FOREIGN PATENT DOCUMENTS

JP    H07-283409    10/1995

* cited by examiner

Primary Examiner—Ngân V. Ngô
Assistant Examiner—Theresa T. Doan
(74) Attorney, Agent, or Firm—Fish & Richardson PC

(57) ABSTRACT

To reduce ON-state resistance with desired withstand voltage secured, a semiconductor device provided with a gate electrode formed on a semiconductor substrate via a gate insulating film, an LP layer (a P-type body region) formed so that the LP layer is adjacent to the gate electrode, an N-type source region and a channel region respectively formed in the LP layer, an N-type drain region formed in a position apart from the LP layer and an LN layer (a drift region) formed so that the LN layer surrounds the drain region is characterized in that a P-type layer ranging to the LP layer is formed under the gate electrode.

8 Claims, 4 Drawing Sheets

LATERAL DOUBLE DIFFUSED MOS TRANSISTOR

BACKGROUND OF THE INVENTION

1. Field of the Invention

The present invention relates to a semiconductor device and a method of manufacturing thereof, further detailedly relates to lateral double diffused (LD) MOS transistor technique as a high-voltage device utilized for IC for driving a liquid crystal and others.

2. Description of the Related Art

LD MOS transistor structure means structure that a new diffused region is formed by diffusing impurities different in a conductive type in a diffused region formed on the side of the surface of a semiconductor substrate and difference in diffusion in a lateral direction between these diffused regions is utilized for effective channel length and a device having the structure is a device suitable for reducing ON-state resistance because a short channel is formed.

FIG. 8 is a sectional view for explaining a conventional type LD MOS transistor and for an example, N-channel LD MOS transistor structure is shown. The description of P-channel LD MOS transistor structure is omitted, however, both structures are different only in a conductive type and it is well-known that they are the similar structure.

As shown in FIG. 8, a reference number 51 denotes one conductive type of, for example, P-type semiconductor substrate, 52 denotes an N-type well region, an LP layer 53 (composing a P-type body region) is formed in the N-type well region 52, an N-type diffused region 54 is formed in the LP layer 53 and an N-type diffused region 56 is formed in an LN layer 55 (composing a drift region) in the N-type well region 52. A local oxide film 57 and a gate electrode 59 via a gate insulating film 58 are formed on the surface of the substrate and a channel region 60 is formed in the superficial region of the LP layer 53 immediately under the gate electrode 59.

The N-type diffused region 54 functions as a source region and the N-type diffused region 56 functions as a drain region. Also, a reference number 61 denotes a P-type layer for applying electric potential to the LP layer 53 and 62 denotes a layer insulation film.

In the LD MOS transistor, the density of the surface of the LN layer 55 is increased by diffusing the LN layer 55 composing a drift region, current on the surface of the LN layer 55 readily flows and the withstand voltage can be increased.

However, as shown in FIG. 8, the end of the LP layer 53 to be a P-type body region of the LD MOS transistor is under the gate electrode 59 and a range in which the threshold voltage can be regulated exists under an active region.

Therefore, electrostatic focusing at the end of the LP layer 53 and the effect of an electric field from the gate electrode 59 are joined, local current focusing is caused and the driving ability is deteriorated.

Also, as high voltage is applied between the N-type diffused region 56 to be a drain region and the gate electrode 59, the gate insulating film 58 is required to be thickened for high withstand voltage and it prevents further miniaturization.

SUMMARY OF THE INVENTION

The invention is made to solve the problems and intends to provide a semiconductor device being able to be made fine and having a highly withstand voltage.

A semiconductor device according to the invention is provided with a gate electrode formed on a second conductive type of well region formed in a first conductive type of semiconductor substrate via a gate insulating film, a first conductive type of body region formed so that the body region is adjacent to the gate electrode, a second conductive type of source region and a channel region respectively formed in the first conductive type of body region, a second conductive type of drain region formed in a position apart from the first conductive type of body region and a second conductive type of drift region formed so that the drift region surrounds the drain region and is characterized in that as a first conductive type of impurity layer ranging to the first conductive type of body region is formed under the gate electrode, a depletion layer expands with a connection with the first conductive type of impurity layer in the center and a region under the gate electrode is completed depleted.

The semiconductor device according to the invention is also characterized in that the first conductive type of impurity layer is formed in the vicinity of an active region under the gate electrode.

Preferably, the first conductive type of impurity layer is extended from said first conductive type of body region to the direction of the drift region in a state of an impurity diffusion layer having a predetermined width of depth so as to surround the active region under the gate electrode.

More preferably, the first conductive type of impurity layer is extended from said first conductive type of body region for upper side to the direction of the drift region so as to approach for a surface direction of the substrate.

Preferably, the gate insulating film comprises a first insulating film and a second insulating film made of local oxidation film, having thicker than the first insulating film, said gate electrode is formed on the first insulating film and on the second insulating film so that an end of the first conductive type of impurity layer approach to a bottom of the second insulating film.

Preferably, the first conductive type of impurity layer is terminated beneath the gate electrode.

Preferably, the first conductive type of impurity layer is disposed in a depth so that a region surrounded by the first conductive type of body region and said second insulating film is depleted completely under the gate electrode.

More preferably the first conductive type of impurity layer is disposed in a depth of 1 $\mu$m from the first insulating film.

Further, a method of manufacturing the semiconductor device is characterized in that the method includes the following processes, first, a second conductive type of well region is formed by implanting and diffusing impurities of a second conductive type into/in the first conductive type of semiconductor substrate, and a low density first conductive type of impurity layer and a low density second conductive type of impurity layer are formed at an interval by respectively implanting and diffusing impurities of a first conductive type and impurities of a second conductive type into/in the second conductive type of well region. Next, after a region on the substrate is selectively oxidized to form a local oxide film and a gate insulating film is formed in a region except the local oxide film, a middle density first conductive type of impurity layer ranging to the low density first conductive type of impurity layer is formed using resist films respectively having an opening on the local oxide film and on a gate electrode formation region as a mask. Next, a gate electrode is formed from the gate insulating film to the local oxide film and impurities of a second conductive type are implanted using resist films respectively having an opening on a source formation region formed in the low density first conductive type of impurity layer and on a drain formation region formed in the low density second conductive type of impurity layer as a mask to form high density source/drain regions.

The method of manufacturing the semiconductor device is also characterized in that in the process for forming the second conductive type of well region in the method of manufacturing the semiconductor device, plural types of second conductive type of impurities different in a diffusion coefficient are implanted and diffused.

Further, the method of manufacturing the semiconductor device is characterized in that in the process for forming the second conductive type of well region in the method of manufacturing the semiconductor device, after first impurities are implanted and diffused, second impurities are implanted and diffused.

PREFERRED EMBODIMENT OF THE INVENTION

Figure 1:
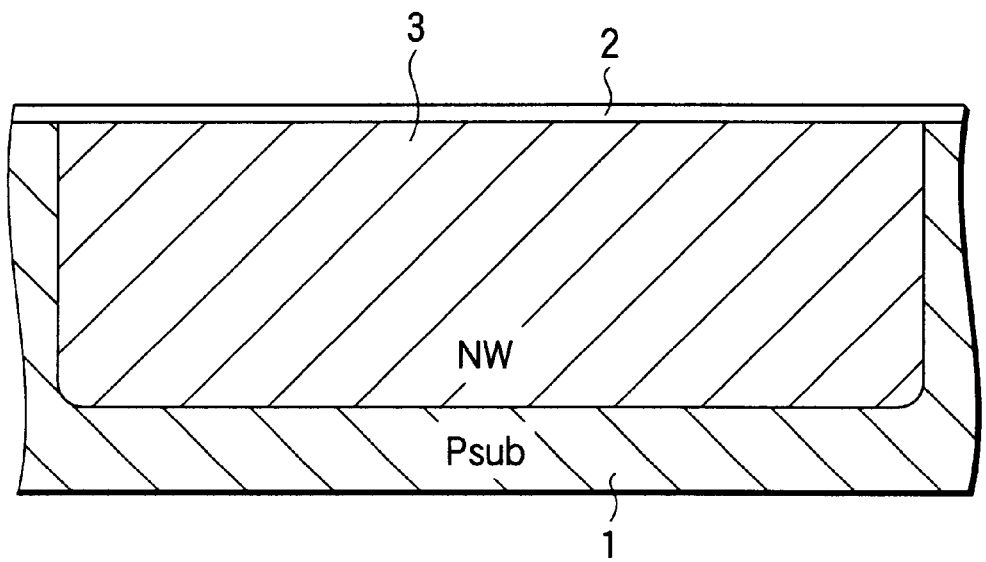
FIG. 1 is a sectional view showing a method of manufacturing a semiconductor device equivalent to one embodiment of the invention.

Referring to the drawings, one embodiment related to a semiconductor device and a method of manufacturing it according to the invention will be described below.

FIGS. 1 to 7 are sectional views showing a method of manufacturing an LD MOS transistor according to the invention in the order of each process and for an example, N-channel LD MOS transistor structure is shown. The description of P-channel LD MOS transistor structure is omitted, however, both structures are different only in a conductive type and it is well-known that they are the similar structure.

First, as shown in FIG. 1, after a pad oxide film 2 is formed on a P-type semiconductor substrate 1, an N-type well region 3 is formed by implanting and diffusing N-type impurities into/in a desired region of the substrate 1 using a resist film (not shown) as a mask. In this process, for the N-type impurities, for example, phosphorus ions are implanted at the accelerating voltage of approximately 160 KeV on an implantation condition of $5 \times 10^{12}/cm^2$ and are thermally diffused at approximately 1200° C. for 16 hours.

Figure 2:
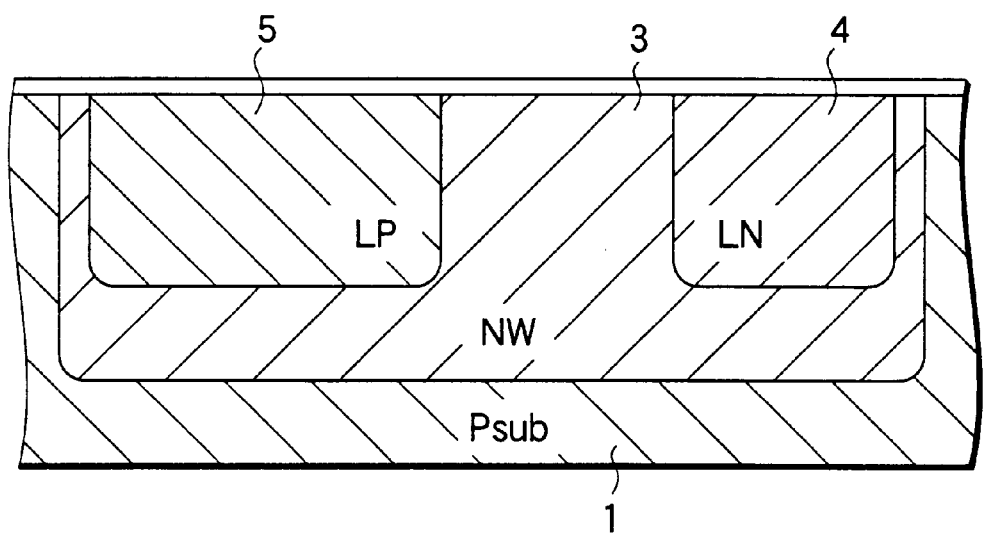
FIG. 2 is a sectional view showing the method of manufacturing the semiconductor device equivalent to one embodiment of the invention.

Next, as shown in FIG. 2, N-type impurities are implanted into a desired region of the substrate 1 using a resist film (not shown) formed on the substrate 1 as a mask. Also, similarly, P-type impurities are implanted into a desired region of the substrate 1 using a different resist film as a mask. A low density N-type layer 4 (hereinafter called an LN layer 4) and a low density P-type layer 5 (hereinafter called an LP layer 5) are formed by diffusing implanted each impurities. The LN layer 4 composes a drift region and the LP layer 5 composes a P-type body region. In this process, for the N-type impurities, for example, phosphorus ions are implanted at the accelerating voltage of approximately 100 KeV on an implantation condition of $4 \times 10^{12}/cm^2$, for the P-type impurities, for example, boron ions are implanted at the accelerating voltage of approximately 80 KeV on an implantation condition of $1.2 \times 10^{13}/cm^2$ and each ions are thermally diffused at approximately 1100° C. for four hours.

Figure 3:
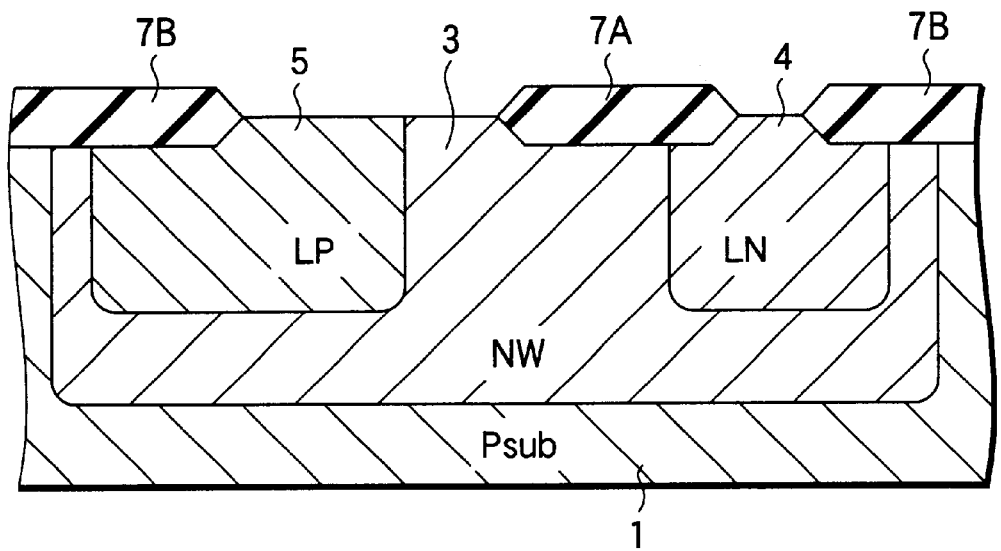
FIG. 3 is a sectional view showing the method of manufacturing the semiconductor device equivalent to one embodiment of the invention.

Next, as shown in FIG. 3, a region on the surface of the substrate is selective oxidized using a silicon nitride film (not shown) formed on the substrate 1 as a mask to form a local oxide film (a local oxide film 7A that functions as a gate insulating film together with a gate insulating film 8 described later and a local oxide film 7B as an element isolation film) having the thickness of approximately 800 nm.

Figure 4:
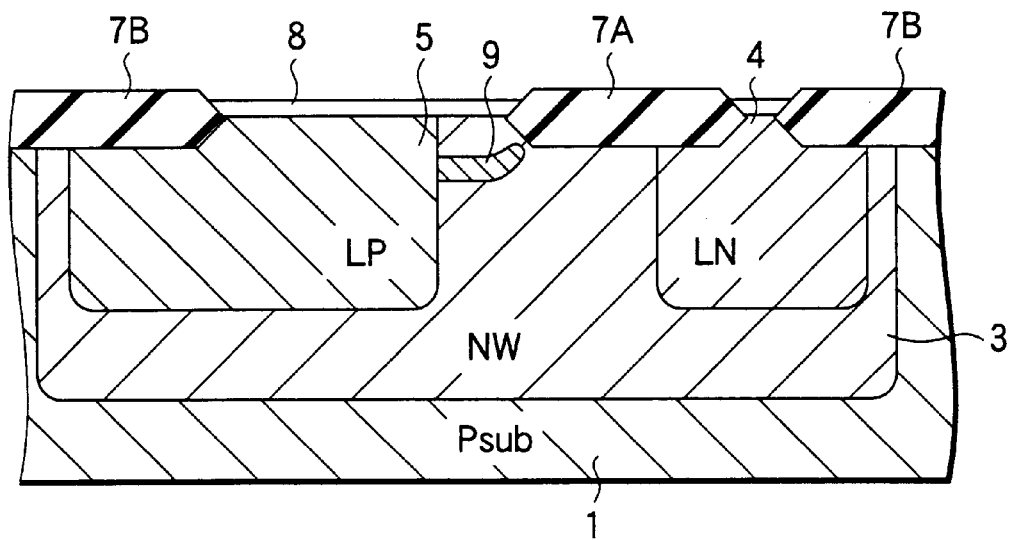
FIG. 4 is a sectional view showing the method of manufacturing the semiconductor device equivalent to one embodiment of the invention.

Also, as shown in FIG. 4, the gate insulating film 8 having the thickness of approximately 45 nm is formed on the substrate 1 except the local oxide film 7 by thermal oxidation. As not only a P-type layer 9 but the N-type well region 3 from the end of the P-type layer 9 to the local oxide film 7A (shown by an arrow 7a in FIG. 7) are depleted in operation by the P-type layer 9 formed so that the P-type layer ranges to the LP layer 5 under the gate electrode 10 though the details are described later and no high voltage is applied between a drain region 13 and the gate electrode 10, the thickness of the gate insulating film 8 may be equal to the thickness of a gate insulating film of a MOS transistor of 5 V in case no high voltage is applied between a source region 12 and the substrate 1 and therefore, both gate insulating films can be formed in the same process.

The P-type layer 9 is formed so that the P-type layer ranges to the LP layer 5 at desired depth (in the vicinity under a channel region 11, in this embodiment, the surface area of a junction is secured largely and complete depletion is enabled by forming at the depth of 1 μm or less from the superficial layer of the substrate) in the substrate 1 (in the N-type well region 3) in a gate electrode formation region by implanting P-type impurities using a resist film (not shown) having an opening on the gate electrode formation region formed on the substrate 1 and the local oxide film 7A as a mask. In this process, the P-type layer 9 is formed by implanting boron ions for example for the P-type impurities by the quantity of $5 \times 10^{12}/cm^2$ at the accelerating voltage of approximately 160 KeV. The P-type layer 9 is formed so that it approaches the side of the surface of the substrate as the P-type layer approaches the side of the local oxide film 7A in accordance with the shape of the local oxide film 7A.

Figure 5:
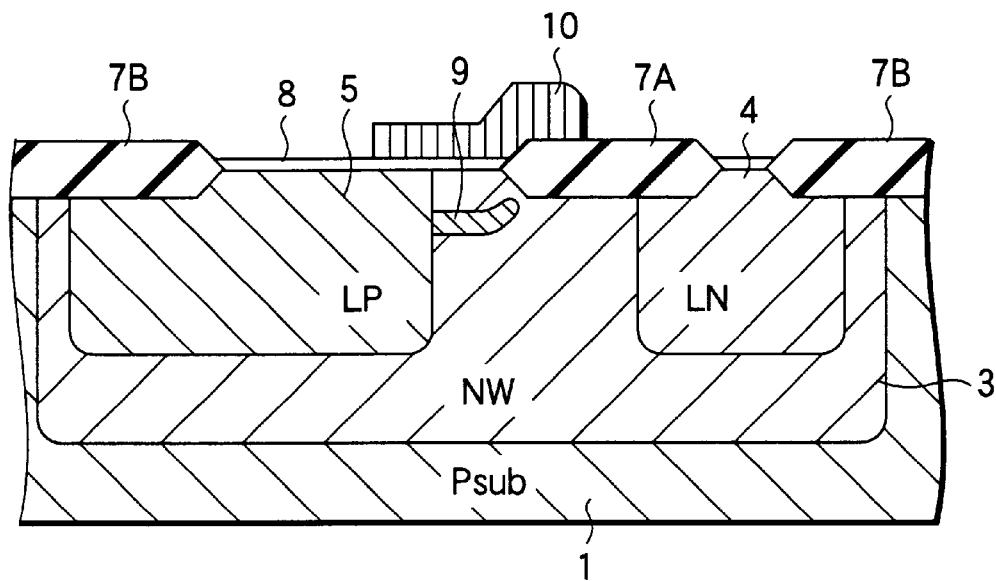
FIG. 5 is a sectional view showing the method of manufacturing the semiconductor device equivalent to one embodiment of the invention.

Further, as shown in FIG. 5, after a conductive film is formed on the substrate 1, it is patterned so that it ranges from the gate insulating film 8 to the local oxide film 7A and the gate electrode 10 is formed so that it has the thickness of approximately 400 nm. The gate electrode 10 in this embodiment is composed of a polysilicon film conducted by doping phosphorus using $POCl_3$ as a thermal diffusion source. Further, the gate electrode may be also composed of a polyside electrode acquired by laminating a tungsten silicide (WSix) film and others on the polysilicon film.

Figure 6:
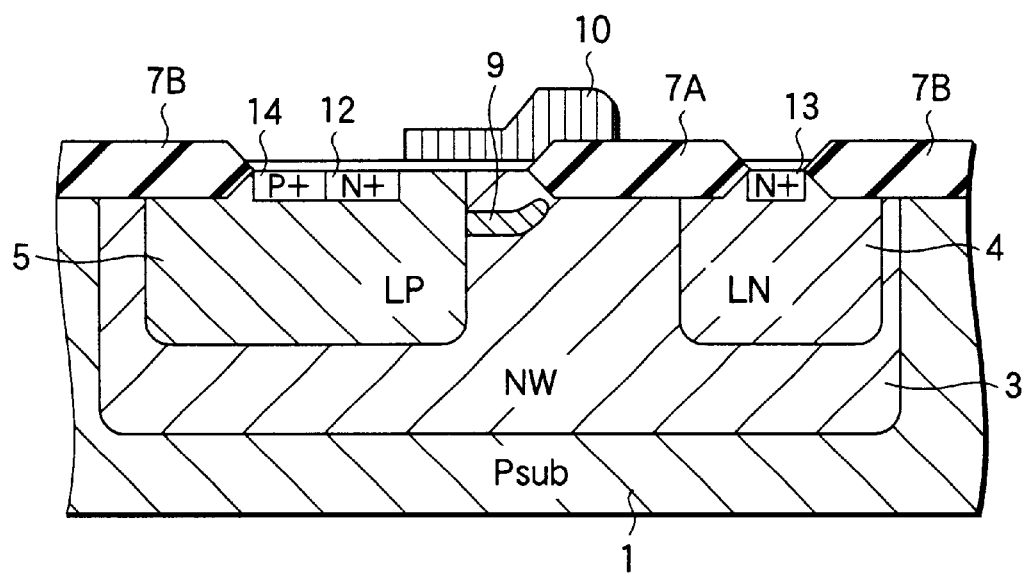
FIG. 6 is a sectional view showing the method of manufacturing the semiconductor device equivalent to one embodiment of the invention.

Also, as shown in FIG. 6, N-type impurities are implanted using resist films (not shown) respectively having an opening on a source formation region formed in the LP layer 5 (the P-type body region) and on a drain formation region formed in the LN layer 4 (the drift region) as a mask, and an N-type diffused region 12 (hereinafter called a source region 12) and an N-type diffused region 13 (hereinafter called a drain region 11) are formed. In this process, a source region and a drain region in so-called DDD structure are formed by implanting phosphorus ions for example by the quantity of $1 \times 10^{14}/cm^2$ at the accelerating voltage of approximately 70 KeV and further, implanting arsenic ions for example by the quantity of $6 \times 10^{15}/cm^2$ at the accelerating voltage of approximately 80 KeV. Further, the structure of the source region 12 and the drain region 13 is not limited to the DDD structure and may be also so-called LDD structure.

A high density P-type layer 14 is formed in a position adjacent to the source region 12 to apply electric potential to the LP layer 5 (the P-type body region). In this process, the P-type layer 14 is formed by implanting boron ions for example for P-type impurities by the quantity of $2 \times 10^{15/cm2}$ at the accelerating voltage of approximately 30 KeV.

Figure 7:
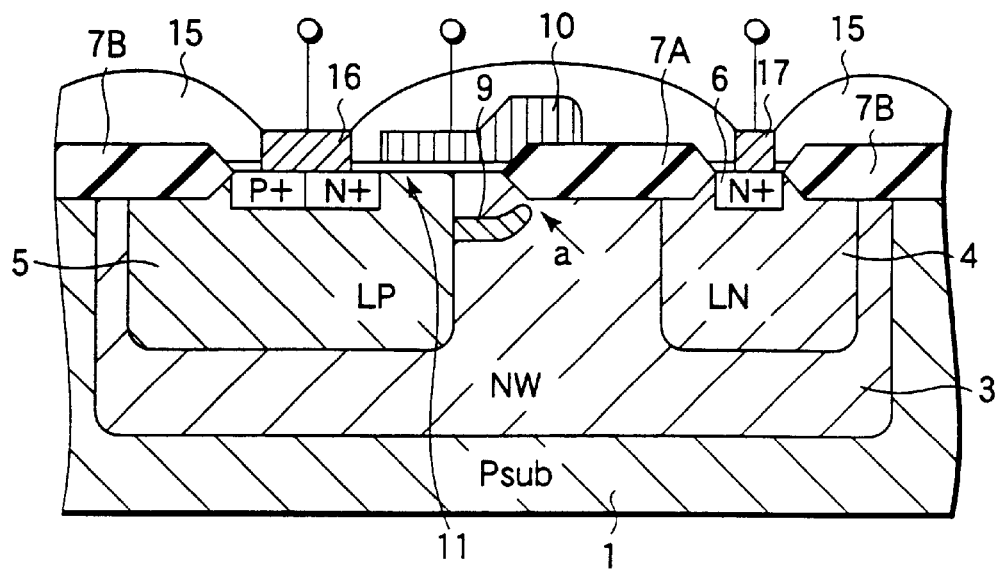
FIG. 7 is a sectional view showing the method of manufacturing the semiconductor device equivalent to one embodiment of the invention.
Figure 8:
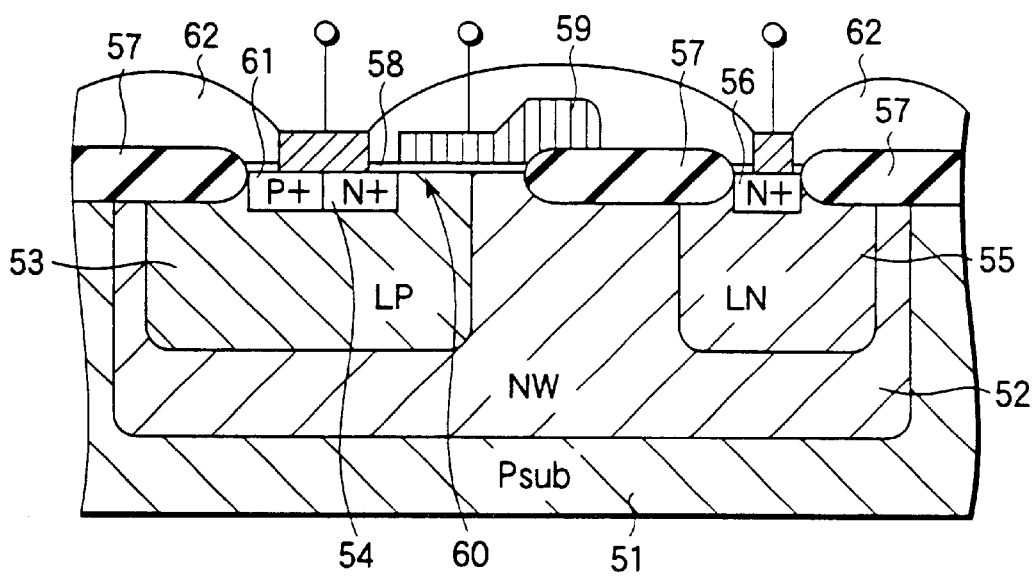
FIG. 8 is a sectional view showing a conventional type semiconductor device.

As shown in FIG. 7, after a source electrode 16 and a drain electrode 17 are formed via a layer insulation film 15 as in conventional type configuration, a passivation film (not shown) is formed and the semiconductor device is completed.

As described above, in the invention, a depletion layer expands with a junction in the center by formed the P-type layer 9 so that the P-type layer ranges to the LP layer 5 as the P-type body region under the gate electrode 10 (in the vicinity under the channel region) and a part under the gate electrode can be readily depleted. Therefore, ON-state resistance is reduced by densifying the surface of the N-type well region 3 and the driving ability can be enhanced.

For a method of densifying the surface of the N-type well region 3, the following methods are conceivable in the invention.

First, a method of further implanting impurities having a diffusion coefficient different from that of a phosphorus ion such as an arsenic ion in addition to phosphorus ions for forming the N-type well region and diffusing plural types of N-type impurities (the distribution of the density composed of arsenic ions is generated on the side near to the superficial layer of the substrate and the distribution of the density composed of phosphorus ions is generated on the deep side of the substrate) is conceivable.

Further, a second method of implanting phosphorus ions or arsenic ions and diffusing them again in diffusion time shorter than that in first diffusion to densify the surface of the N-type well region after phosphorus ions are implanted in the process for forming the N-type well region and the N-type well region is formed by first diffusion is conceivable.

The surface on the P-type layer 9 of the N-type well region 3 can be densified with desired withstand voltage (for example, 80 V) secured by using these methods, ON-state resistance can be reduced and the driving ability can be enhanced.

As not only the P-type layer 9 but a region under the gate electrode 10 are depleted in operation, no high voltage is applied between the drain region and the gate electrode, in case input voltage to the gate electrode is 5 V for example, the gate insulating film 8 can be thinned up to similar extent to a gate insulating film in a system of 5V and the driving ability can be enhanced.

According to the invention, as a depletion layer expands with a junction in the center by forming the first conductive type of layer so that the first conductive type of layer ranges to the first conductive type of body region in a desired position under the gate electrode and a region under the gate electrode can be readily depleted, the driving ability can be enhanced with desired withstand voltage secured even if the surface of the second conductive type of well region is densified.

Also, as the region under the gate electrode is also depleted as described above, no high voltage is applied between the drain region and the gate electrode and in case input voltage to the gate electrode is 5V for example, the gate insulating film can be thinned up to the same extent as the thickness in a system of 5V and the driving ability can be enhanced.

What is claimed is:

1. A semiconductor device provided with a gate electrode formed on a semiconductor substrate via a gate insulating film, a first conductive type of body region formed so that the body region is adjacent to the gate electrode, a second conductive type of source region and a channel region respectively formed in the first conductive type of body region, a second conductive type of drain region formed in a position apart from the first conductive type of body region and a second conductive type of drift region formed so that the drift region surrounds the drain region, wherein:

a first conductive type of impurity layer ranging to the first conductive type of body region is formed under the gate electrode.

2. A semiconductor device according to claim 1, wherein:
    the first conductive type of impurity layer is formed in the vicinity of an active region under the gate electrode.

3. A semiconductor device according to claim 2, wherein:
    the first conductive type of impurity layer is extended from said first conductive type of body region to the direction of the drift region in a state of an impurity diffusion layer having a predetermined width of depth so as to surround the active region under the gate electrode.

4. A semiconductor device according to claim 3, wherein:
    the first conductive type of impurity layer is extended from said first conductive type of body region for upper side to the direction of the drift region so as to approach for a surface direction of the substrate.

5. A semiconductor device according to claim 4, wherein:
    the gate insulating film comprises a first insulating film and a second insulating film made of local oxidation film, having thicker than the first insulating film, said gate electrode is formed on the first insulating film and on the second insulating film so that an end of the first conductive type of impurity layer approach to a bottom of the second insulating film.

6. A semiconductor device according to claim 5, wherein:
    the first conductive type of impurity layer is terminated beneath the gate electrode.

7. A semiconductor device according to claim 6, wherein:
    the first conductive type of impurity layer is disposed in a depth so that a region surrounded by the first conductive type of body region and said second insulating film is depleted completely under the gate electrode.

8. A semiconductor device according to claim 6, wherein:
    the first conductive type of impurity layer is disposed in a depth of 1 $\mu$m from the first insulating film.

* * * * *